United States Patent [19]
Saito et al.

[11] Patent Number: 5,563,836
[45] Date of Patent: Oct. 8, 1996

[54] FAST ACCESS MULTI-BIT RANDOM ACCESS MEMORY

[76] Inventors: Tamio Saito, 1013 Salt Ct., Redwood Shores, Calif. 94065; Masahiro Tsunoda, 7143 Martwood Way, San Jose, Calif. 95120

[21] Appl. No.: 563,991

[22] Filed: Nov. 29, 1995

Related U.S. Application Data

[63] Continuation of Ser. No. 377,141, Jan. 23, 1995, abandoned.

[51] Int. Cl.$^6$ .................................. G11C 7/00
[52] U.S. Cl. ............. 365/210; 365/189.07; 365/189.09
[58] Field of Search .................... 365/210, 189.07, 365/189.09, 190, 156, 149; 341/161

[56] References Cited

U.S. PATENT DOCUMENTS

| | | | |
|---|---|---|---|
| 4,661,929 | 4/1987 | Aoki et al. | 365/189 |
| 4,872,142 | 10/1989 | Hannai | 365/189.07 |
| 5,184,324 | 2/1993 | Ohta | 365/149 |
| 5,418,739 | 5/1995 | Takasugi | 365/149 |
| 5,459,686 | 10/1995 | Saito | 365/149 |

FOREIGN PATENT DOCUMENTS

| | | |
|---|---|---|
| 60-239994 | 11/1985 | Japan . |
| 62-2650 | 1/1987 | Japan . |
| 63-195897 | 8/1988 | Japan . |
| 63-195896 | 8/1988 | Japan . |
| 1-192083 | 8/1989 | Japan . |

*Primary Examiner*—Do Hyun Yoo
*Attorney, Agent, or Firm*—Edward B. Weller; Bobby K. Truong

[57] ABSTRACT

A random access memory, having multi-bit memory cells, includes a successive approximation analog-to-digital (SAAD) converter and a comparator for reading data from the memory cells. In reading data from a cell, the SAAD generates a first reference voltage. This first reference voltage is compared, by the comparator, to the voltage stored in the cell to derive a first comparison result. Based on this first comparison result, a first bit of data is determined. Thereafter, the SAAD generates a second reference voltage based on the first reference voltage and the first comparison result. This second reference voltage is compared, by the comparator, to the voltage stored in the cell to derive a second comparison result. Based on this second comparison result, a second bit of data is determined. This process of: (1) generating a new reference voltage based on a previous reference voltage and a previous comparison result (2) comparing the new reference voltage to the voltage stored in the memory cell to derive a new comparison result; and (3) deriving a new bit of data based on the new comparison result, is repeated until all of the data bits stored in the memory cell are determined. By reading data from a multi-bit memory cell in this manner, an n number of bits of data can be read in an n number of clock cycles.

12 Claims, 4 Drawing Sheets

| VOLTAGE | DATA |
|---|---|
| 3.75 | 1111 |
| 3.50 | 1110 |
| 3.25 | 1101 |
| 3.00 | 1100 |
| 2.75 | 1011 |
| 2.50 | 1010 |
| 2.25 | 1001 |
| 2.00 | 1000 |
| 1.75 | 0111 |
| 1.50 | 0110 |
| 1.25 | 0101 |
| 1.00 | 0100 |
| 0.75 | 0011 |
| 0.50 | 0010 |
| 0.25 | 0001 |
| 0.00 | 0000 |

Fig. 6

FAST ACCESS MULTI-BIT RANDOM ACCESS MEMORY

This is a continuation of application Ser. No. 08/377,141 filed on Jan. 23, 1995 now abandoned.

FIELD OF THE INVENTION

This invention relates generally to semiconductor memories having multi-bit memory cells, and more particularly to a multi-bit random access memory which is capable of reading one bit of data per clock cycle.

BACKGROUND OF THE INVENTION

As computers have grown in complexity, the demand for more memory has grown. This in turn has led to a greater demand for higher density memories (memories capable of storing more bits of information in the same semiconductor surface area). In an attempt to increase the storage density of memories, the concept of a multi-bit memory cell was developed. More specifically, it was envisioned that if each memory cell were able to store more than one bit of data, then the storage density of the memory would be increased. Consequently, efforts have been made in recent years to develop memories using multi-bit memory cells. Most of the multi-bit memory cell work has been done in connection with DRAM memory cells.

In general, a multi-bit DRAM cell has the same construction as a single-bit DRAM cell, consisting of a storage capacitor and a cell gate. The difference between the multi-bit cell and the single-bit cell is manifested in the way the cells are used. To illustrate how a single memory cell can be used to store a plurality of bits of data, suppose that it is desirable to store two bits of data in a memory cell, and that the voltages to be stored in the memory cell range from 0 to 4 volts. In order to use the memory cell as a two-bit memory cell, the voltage range is first divided into four distinct voltage sub-ranges: (1) 0 to 1 volt; (2) 1 to 2 volts; (3) 2 to 3 volts; and (4) 3 to 4 volts. Each voltage sub-range represents a certain combination of two data bits. For example, the first sub-range can represent the data bits "00", the second sub-range can represent the data bits "01", the third sub-range can represent the data bits "10", and the fourth sub-range can represent the dam bits "11". Once the voltage range is subdivided in this manner, two-bit data can be stored in the memory cell by applying and storing an appropriate voltage in the cell. For example, the data bits "10" can be stored in the memory cell by storing a voltage between 2 and 3 volts in the memory cell. Likewise, the data bits "11" can be stored in the memory cell by storing a voltage between 3 and 4 volts in the memory cell. Thus, by dividing the full voltage range into voltage sub-ranges, and then storing appropriate voltage levels in the memory cell, a single-bit memory cell can be converted into a multi-bit memory cell. This same concept can be extended to store three or more data bits per cell. In general, to store an n number of bits in a single cell, $2^n$ distinct voltage sub-ranges will need to be created.

Storing data in a multi-bit memory cell is only one part of creating a practicable multi-bit memory. The other important consideration is that of reading data from the cells. In the prior art, two different reading methodologies have been implemented. According to a first reading methodology, commonly known as the serial A/D conversion method, data is read from a multi-bit memory cell by repeatedly comparing the voltage stored in the memory cell with a stepped reference voltage. More specifically, with each clock cycle, the reference voltage is increased by a certain step and then compared with the voltage stored in the memory cell. By comparing the stored voltage with all of the possible voltages which could be stored in the cell, the data stored in the cell is ascertained. This method is advantageous in that it requires little additional circuitry. However, it has proven to be quite slow. In general, to read n-bits of data from a cell, $2^n$ clock cycles are required. For cells which store a relatively large number of bits (four bits, for example), this reading method is too slow to be practicable.

Another reading method which has been implemented in the prior art is commonly known as the flash A/D conversion method. According to this method, each cell is connected to $2^n$ comparators, where n is the number of data bits stored in the cell. Each comparator has one input connected to the output of the cell, and another input connected to a reference voltage. Each of the comparators is connected to a different reference voltage. Data is read from the cell by outputting the voltage stored in the cell to the comparators, and allowing the comparators to compare, simultaneously, the stored voltage to each of the different reference voltages. By so doing, the voltage, and hence, the data stored in the cell is ascertained in a single clock cycle. While this method is significantly faster than the serial conversion method, it has a significant drawback in that it requires a large number of wire connections and a large number of comparators. More specifically, in order to implement the flash conversion method, there needs to be $2^n$ wire connections for each cell to connect each cell to $2^n$ comparators. These connections and comparators consume a very significant amount of surface area on a memory chip. For a memory having a large number of cells, the additional connections and comparators would consume the surface area saved by having multi-bit cells. Thus, a multi-bit memory using the flash conversion method would not provide increased storage density. As shown by this discussion, the reading methodologies of the prior art fail to provide satisfactory results. Thus, there exists a need for an improved reading methodology which would allow for faster reading times but which does not require an overly burdensome amount of additional circuitry.

SUMMARY OF THE INVENTION

In view of the shortcomings of the prior art, the present invention provides an improved method and apparatus for reading data from a multi-bit cell which allows an n number of bits to be read in an n number of clock cycles. According to the method of the present invention, a multi-bit memory cell is preferably read by using a successive approximation analog-to-digital conversion process. Preferably, to read multiple bits of data from a memory cell, a first reference voltage is generated. This first reference voltage is in effect a guess or an approximation of the voltage stored in the memory cell. Once generated, the first reference voltage is compared to the voltage stored in the memory cell to derive a first comparison result. Based on this first comparison result, a first bit of data is determined. Thereafter, a second reference voltage is generated. This second reference voltage is preferably generated based upon the first reference voltage and the first comparison result, and represents a second approximation of the voltage stored in the memory cell. Once generated, the second reference voltage is compared to the voltage stored in the memory cell to derive a second comparison result. Based on this second comparison result, a second bit of data is determined. Preferably, this process of successively approximating the voltage stored in the memory cell, comparing the approximation to the stored voltage to derive a comparison result, and determining a bit of data based upon the comparison result, is repeated until the proper number of bits of data have been read from the memory cell. By reading the memory cell in this manner, an n-number of bits of data can be read in an n-number of clock cycles.

The reading apparatus of the present invention preferably comprises a successive approximation analog-to-digital (SAAD) converter having an input and an output, a comparator having a first input coupled to a memory cell, and a second input, and an output coupled to the input of the SAAD, and a dummy cell coupled to both the output of the SAAD and the second input of the comparator, In operation, the SAAD generates and stores a reference voltage in the dummy cell. This reference voltage is compared, by the comparator, to the voltage stored in the memory cell to derive a comparison result, which is provided to the SAAD. Based on this comparison result, the SAAD determines a first bit of data. Also, based on the comparison result and the previous reference voltage, the SAAD generates a second reference voltage. This second reference voltage is stored in the dummy cell, and is thereafter compared, by the comparator, to the voltage stored in the memory cell to derive a second comparison result, which is provided to the SAAD. Based on this second comparison result, the SAAD determines a second bit of data. Preferably, this operational process continues until a proper number of data bits have been derived from the memory cell.

The present invention overcomes the shortcomings of the prior art reading methodologies. First, as noted above, the reading method of the present invention makes it possible to read n bits of data in n clock cycles. This is significantly faster than the serial conversion method of the prior art. Also, note that this speed improvement is achieved without requiring an inordinate amount of additional circuitry. In the apparatus discussed above, only one comparator and one SAAD is used. There is no need for $2^n$ comparators or $2^n$ connections. Thus, the present invention achieves significant performance improvement with only a slight increase in circuitry. By implementing the present invention, a higher density memory can be created.

DETAILED DESCRIPTION OF THE PREFERRED EMBODIMENT

Figure 1:
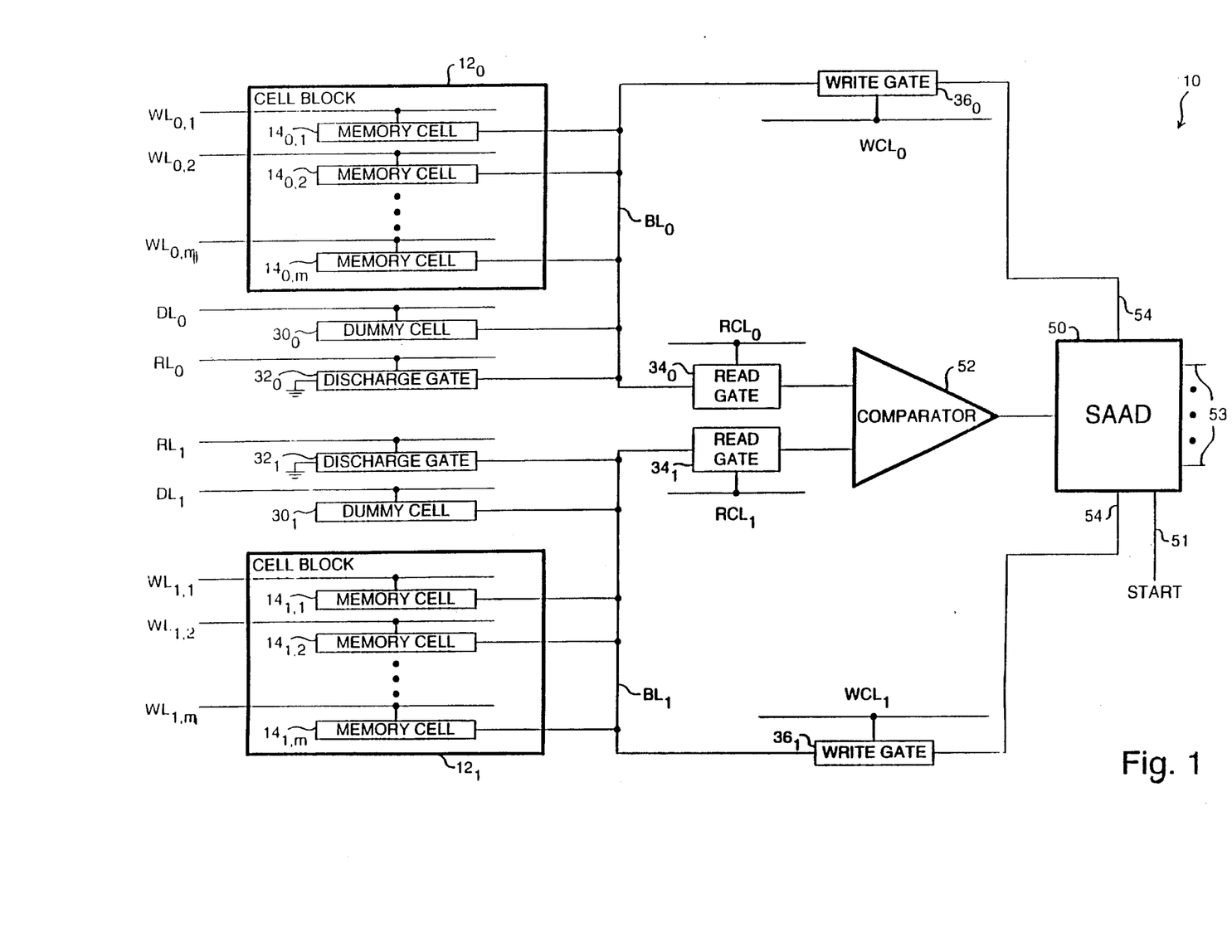
FIG. 1 is block diagram representation of a memory portion 10 wherein the present invention is implemented.

With reference to FIG. 1, there is shown a portion 10 of a memory having the present invention implemented therein. Portion 10 may be replicated any desired number of times to create a larger memory having a desired capacity. As shown, memory portion 10 preferably comprises a pair of complementary cell blocks $12_0$, $12_1$, each cell block having an arbitrary number m of memory cells 14 included therein. Specifically, cell block $12_0$ comprises memory cells $14_{0,1}$–$14_{0,m}$, while cell block $12_1$ comprises memory cells $14_{1,1}$–$14_{1,m}$. Also, each cell block $12_0$, $12_1$ preferably has a bit line associated therewith. As shown, bit line $BL_0$ is associated with cell block $12_0$, while bit line $BL_1$ is associated with cell block $12_1$. As will be explained later, these bit lines $BL_0$, $BL_1$ will be used to read data from the memory cells 14. Preferably, bit lines $BL_0$ and $BL_1$ are constructed such that they have substantially equal capacitances. This helps to negate the effects of stray capacitance.

Preferably, each of the memory cells 14 in the two cell blocks $12_0$, $12_1$ is a multi-bit memory cell (i.e. is a cell capable of storing more than one bit of data) having two terminals, a control terminal and a data terminal. The control terminal of each memory cell 14 is preferably coupled to a corresponding word line to receive a control signal therefrom, while the data terminal is preferably coupled to a corresponding bit line to receive data therefrom and to output data thereto. More specifically, the memory cells $14_{0,1}$–$14_{0,m}$ in cell block $12_0$ preferably have their control terminals coupled to one of the word lines $WL_{0,1}$–$WL_{0,m}$, and their data terminals coupled to bit line $BL_0$. Similarly, the memory cells $14_{1,1}$–$14_{1,m}$ in cell block $12_1$ preferably have their control terminals coupled to one of the word lines $WL_{1,1}$–$WL_{1,M}$, and their data terminals coupled to the bit line $BL_1$. For each of the memory cells 14, it is the control terminal which determines whether the memory cell is activated. If a proper control signal is received at the control terminal, then the cell will be activated and data will be able to flow into and out of the cell. Otherwise, the cell will remain closed to the rest of the memory.

The memory cells 14 may take on a variety of structures. For example, memory cells 14 may take the form of conventional dynamic random access memory (DRAM) cells, each comprising a capacitor and a cell gate. The present invention may be implemented using such a cell structure. More preferably, however, because the memory cells 14 will be used to store multiple bits of data, the memory cells 14 preferably take the form shown in FIG. 2, wherein the cell 14 comprises a storage capacitor 20, an n-channel MOSFET QN, a p-channel MOSFET QP, and an inverter 22. Preferably, the n-channel MOSFET QN has its gate terminal coupled to a corresponding word line, its source terminal coupled to the capacitor 20, and its drain terminal coupled to a corresponding bit line, while the p-channel MOSFET QP has its gate terminal coupled to the word line via the inverter 22, its source terminal coupled to the capacitor, and its drain terminal coupled to the bit line.

Figure 2:
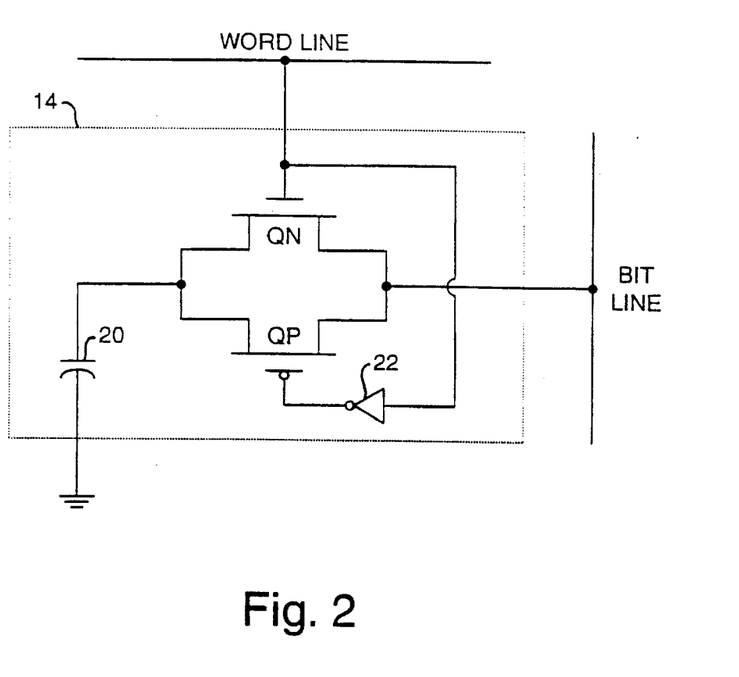
FIG. 2 shows a preferred cell structure for the memory cells 14 used in the memory portion 10 of FIG. 1.

In memory cell 14, capacitor 20 is the voltage, and hence, the data storage element. Storage capacitor 20 may be constructed using a number of different materials, including silicon dioxide. In the preferred embodiment, in order to increase the length of time that charge remains in the cell 14, storage capacitor 20 preferably has a dielectric constant of at least 1.5, and more preferably a dielectric constant greater than or equal to 2, which is a relatively large dielectric constant. A capacitor having such a large dielectric constant may be constructed using a number of different materials. These materials may include Tantalum Oxide ($Ta_2O_5$, $Ta_xO_{1-x}$), Titanium Oxide ($Ti_2O_2$, $Ti_xO_{1-x}$), Titanium Barium Oxide ($Ti_xBa_yO_{1-x-y}$), Tantalum Nitride ($Ta_xN_{1-x}$), Titanium Nitride ($Ti_xN_{1-x}$), and Zirconium Oxide ($Zr_xO_{1-x}$). As a matter of nomenclature, note that the subscripts (x, y, 1–x, 1–x–y) used above represent the percentages of the atoms of elements found in a particular substance, where x is between 0 and 1, and x+y is between 0 and 1. For example, the substance $Ta_{0.5}O_{0.5}$ has 50% Tantalum atoms and 50% Oxygen atoms, while the substance $Ti_{0.25}Ba_{0.25}O_{0.5}$ has 25% Titanium atoms, 25% Barium atoms, and 50% Oxygen atoms. A notation, such as $Ta_xO_{t-x}$, indicates that any combination of percentages of Tantalum and Oxygen may be used. Thus, many different materials, and many different mixtures of materials, may be used to construct capacitor 20. Other materials which may be used to construct storage capacitor 20 include polyethylene and Lead Zirconium Titanium Oxide (PZTO) ($Pb_{1.10}Zr_{0.48}Ti_{0.52}O_{3.1}$). The subscripts in PZTO represent atomic ratios. That is, for each 1.10 lead atoms, there are 0.48 Zirconium atoms, 0.52 Titanium atoms, and 3.1 Oxygen atoms. These and other materials may be used to construct the storage capacitor 20.

The cell structure shown in FIG. 2 has been chosen because of its noise-canceling capability. To elaborate, notice that when a proper control signal is received on the word line, both the n-channel MOSFET QN and the p-channel MOSFET QP are turned on to couple the capacitor 20 to the bit line. The n-channel MOSFET QN is turned on directly by the control signal, while the p-channel MOSFET QP is turned on by the inversion of the control signal. Because both transistors QN, QP are turned on at the same time, both will simultaneously generate noise signals. Because the transistors QN, QP are of opposite polarity, however, their noise signals will cancel each other. Thus, noise effects are minimized by the cell structure of FIG. 2.

The effect of noise or transient signals is an important consideration in multi-bit memory cells. As mentioned previously, multiple bits of data are stored in a memory cell by dividing the full voltage range of the memory cell into a number of voltage sub-ranges. As the number of bits stored in the memory cell increases, the number of voltage sub-ranges also increases. As the number of voltage sub-ranges increases, the voltage step between voltage sub-ranges decreases. For memory cells which store a large number of bits, the voltage step between voltage sub-ranges becomes sufficiently small that noise signals can alter the dam stored in the memory cells. To minimize the effects of noise, and thereby maximize the number of bits of dam that can be stored in a memory cell, a noise-canceling cell structure such as that shown in FIG. 2 is preferably used as the basic memory cell.

Referring again to FIG. 1, portion 10 preferably further comprises a pair of dummy cells $30_0$, $30_1$, each having a control terminal coupled to a dummy line, and a data terminal coupled to a bit line. More particularly, dummy cell $30_0$ has its control terminal coupled to dummy line $DL_0$ and its data terminal coupled to bit line $BL_0$, while dummy cell $30_1$ his its control terminal coupled to dummy line $DL_1$ and its data terminal coupled to bit line $BL_t$. Preferably, dummy cells $30_0$, $30_1$ have the same construction as the memory cells 14, such as that shown in FIG. 2. Even more specifically, dummy cells $30_0$, $30_1$ preferably have the same capacitances as the memory cells 14. This helps to minimize the effects of stray capacitance. As will be explained later, dummy cells $30_0$ and $30_1$ are used to read data from the memory cells 14.

Portion 10 preferably further comprises several pairs of gates, including discharge gates $32_0$, $32_1$, read gates $34_0$, $34_1$, and write gates $36_0$, $36_1$, which serve to selectively couple, in response to control signals received at their control terminals, certain components in portion 10 to certain other components. Specifically: (1) discharge gate $32_0$ selectively couples, in response to a control signal received on reset line $RL_0$, bit line $BL_0$ to ground to discharge the bit line: (2) discharge gate $32_1$ selectively couples, in response to a control signal received on reset line $RL_1$, bit line $BL_1$ to ground to discharge the bit line: (3) read gate $34_0$ selectively couples, in response to a control signal received on read control line $RCL_0$, bit line $BL_0$ to an input of the comparator 52; (4) read gate $34_1$ selectively couples, in response to a control signal received on read control line $RCL_1$, bit line $BL_1$ to another input of the comparator 52; (5) write gate $36_0$ selectively couples, in response to a control signal received on write control line $WCL_0$, bit line $BL_0$ to the analog output 54 of the successive approximation analog-to-digital converter (SAAD) 50; and (6) write gate $36_1$ selectively couples, in response to a control signal received on write control line $WCL_1$, bit line $BL_1$ to the analog output 54 of the SAAD 50. The utilization of these gates in reading data from one of the memory cells 14 will be described in a later section.

Figure 3:
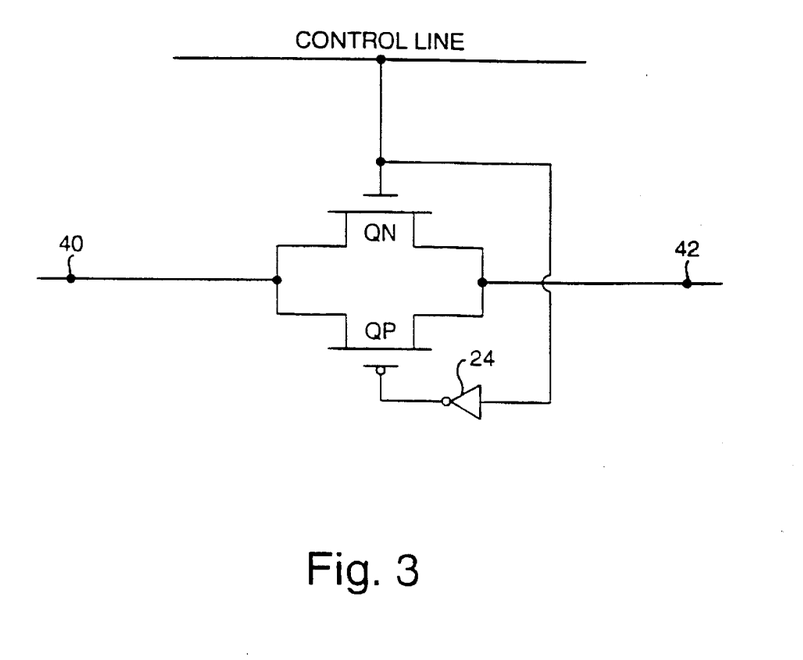
FIG. 3 shows a preferred gate structure for the gates 32, 34, 36 used in the memory portion 10 of FIG. 1.

Preferably, each of these gates 32, 34, 36 has the structure shown in FIG. 3, comprising an n-channel MOSFET QN, a p-channel MOSFET QP, and an inverter 24. The n-channel MOSFET QN preferably has its gate terminal coupled to a control line for receiving a control signal therefrom, its source terminal coupled to a first component via terminal 40, and its drain terminal coupled to another component via terminal 42. Similarly, the p-channel MOSFET QP preferably has its gate terminal coupled to the control line via the inverter 24, its source terminal coupled to terminal 40, and its drain terminal coupled to terminal 42. As described above in connection with FIG. 2, this gate structure is advantageous because it minimizes the generation of noise signals. By implementing this gate structure in gates 32, 34, and 36 of portion 10, noise creation and transference will be kept to a minimum.

Referring again to FIG. 1, in addition to the components already described, portion 10 preferably further comprises comparator 52 and SAAD 50. Comparator 52 serves to compare voltages appearing on bit lines $BL_0$ and $BL_1$ to each other, and to provide a comparison result at its output. This comparison result is provided to the input of the SAAD 50. In response, SAAD 50 performs two main tasks. First, SAAD 50 successively generates and outputs reference voltages on its analog output 54. As will be explained, these reference voltages are compared by comparator 52 to the voltage stored in a target memory cell (from which data is to be read) to derive comparison results. Second, based on the comparison results from the comparator 52, SAAD 50 determines the data bits stored in the target memory cell. These data bits are provided on the digital outputs 53 of the SAAD 50. The SAAD 50 begins operation in response to a "start" signal received on line 51. SAAD's of the type used in the present invention are known. For example, a SAAD having a successive approximation register (SAR) is described in "VLSI Design Techniques for Analog and Digital Circuits ", by R. Geider, P. Allen, and N. Strader, McGraw Hill, 1990, pp. 651–659, which is incorporated herein by this reference. Thus, the structure of SAAD 50 need not be elaborated upon herein. Rather, the manner in which the SAAD 50 is used in portion 10 to facilitate the reading of data from a memory cell 14 will be emphasized. With reference to the flow diagram provided in FIG. 4 and the block diagram shown in FIG. 1, the operation of portion 10 will now be described.

As an initial matter, it should be noted that the control signals used to control the various components in portion 10 (such as SAAD 50 and the various gates and cells) are preferably provided by a control circuit (not shown) external to the portion 10. These control signals include the signals appearing on the word lines $WL_{0,1}-WL_{0,m}$ and $WL_{1,1}-WL_{1,m}$, the dummy lines $DL_0$, $DL_1$, the reset lines $RL_0$, $RL_1$, the read control lines $RCL_0$, $RCL_1$, the write control lines $WCL_0$, $WCL_1$, and the start line 51. This control circuit, which may take the form of a state machine, is similar to the control circuits typically found on multi-bit memories for controlling access to the memory cells. As will be made clear in the following description, this control circuit cooperates with the SAAD 50 to carry out the reading methodology of the present invention.

Figure 4:
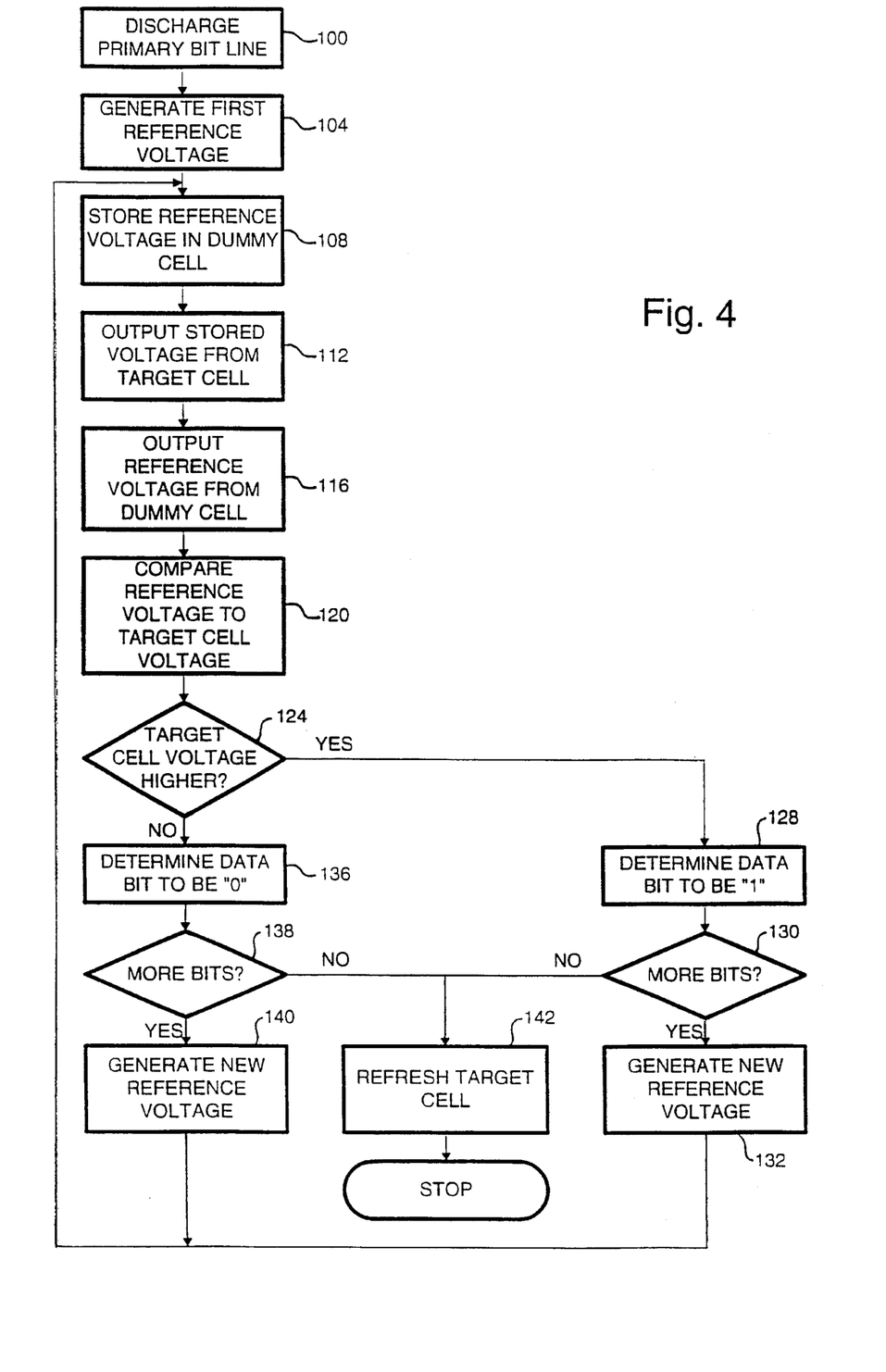
FIG. 4 is an operational flow diagram illustrating the reading methodology of the present invention.

In order to read data out of portion 10, a target cell (i.e. a cell from which data is to be read) is first selected. Once the target cell is selected, the primary and complementary cell blocks, and the primary and complementary bit lines are determined. As a matter of terminology, the cell block having the target cell contained therein is designated the primary cell block, while the other cell block is designated the complementary cell block. Also, the bit line associated with the primary cell block is designated as the primary bit line while the bit line associated with the complementary cell block is designated as the complementary bit line. Which cell block and which bit line is primary depends upon which memory cell is selected. For example, if memory cell $14_{0,1}$ is the target cell, then cell block $12_0$ is the primary cell block and bit line $BL_0$ is the primary bit line. On the other hand, if memory cell $14_{1,1}$ is the target cell, then cell block $12_1$ is the primary cell block and bit line $BL_1$ is the primary bit line. For illustrative purposes, it will be assumed here that memory cell $14_{0,1}$ is the target cell. Thus, in the following example, cell block $12_0$ will be the primary cell block, cell block $12_1$ will be the complementary cell block, bit line $BL_0$ will be the primary bit line, and bit line $BL_1$ will be the complementary bit line. With reference to FIGS. 1 and 4, the process of reading data from cell $14_{0,1}$ will now be described.

As shown in FIG. 4, the reading process is initiated by discharging 100 the primary bit line $BL_0$. This is preferably achieved by having the control circuit (not shown) send a control signal on reset line $RL_0$ to turn on the discharge gate $32_0$ coupled to the primary bit line $BL_0$. Once turned on, gate $32_0$ couples the bit line $BL_0$ to ground to remove any lingering charge. This discharging process serves to "cleanse" the primary bit line $BL_0$ before data from the target cell is loaded onto the bit line $BL_0$.

Once the primary bit line is cleansed, the control circuit sends a "start" signal on line 51 to cause the SAAD 50 to begin operation. Preferably, SAAD 50 begins operation by generating 104 a first reference voltage. This first reference voltage represents an initial guess or approximation of the voltage stored in the target cell $14_{0,1}$. Preferably, the first reference voltage is set at approximately the middle of the full voltage range of the memory cell using the following formula:

$$V_{ref}(1) = \frac{1}{2}MSB - \frac{1}{2}LSB, \quad \text{(Eq. 1)}$$

where MSB represents the full range of voltages that can be stored in the memory cell, and LSB represents the voltage step between consecutive voltage sub-ranges. For example, suppose that the memory cell stores voltages ranging from 0–4 volts, and that four bits of data (requiring sixteen voltage sub-ranges) are stored in the memory cell. In such a case, the MSB is 4 volts and the LSB is 4/16 (the full voltage range divided by the number of voltage sub-ranges) or 0.25 volts, Thus, for the memory cell in the present example, the first reference voltage would be set at 1.875 volts.

Note that the first reference voltage is preferably set not exactly at one-half the full voltage range (referred to herein as the midpoint voltage), but at ½ LSB below the midpoint voltage. This is done to minimize the probability of error. To elaborate, the midpoint voltage represents the dividing line between two consecutive voltage sub-ranges. If the reference voltage is set here, and the voltage stored in the target cell happens to be within one of the two voltage sub-ranges adjacent to the midpoint voltage, then a small amount of noise may affect whether the reference voltage is higher than or lower than the voltage in the target cell. In other words, noise may change the outcome of a comparison, which is clearly not desirable. To minimize the probability of this occurring, the reference voltage is preferably set at ½ LSB below the midpoint voltage. This serves to place the reference voltage in the middle of a voltage sub-range rather than at the border of two adjacent voltage sub-ranges. By so doing, the probability that noise will affect the outcome of a comparison is kept to a minimum.

Once SAAD 50 generates the first reference voltage, it sends the reference voltage out on its analog output 54 to both of the write gates $36_0$, $36_1$. Depending on which write gate is activated, the reference voltage will be conveyed to one of the bit lines $BL_0$, $BL_1$. Preferably, the reference voltage is conveyed to the complementary bit line. In the present example, the complementary bit line is $BL_1$. To send the first reference voltage to bit line $BL_1$, the control circuit sends a control signal on write control line $WCL_1$ to activate the write gate $36_1$. Once the first reference voltage reaches bit line $BL_1$, the reference voltage is preferably stored 108 in the dummy cell $30_1$. This is preferably achieved by having the control circuit send a control signal on dummy line $DL_1$ to activate the dummy cell $30_1$. After this is done, the first reference voltage will be stored within the dummy cell $30_1$. The reference voltage is now ready to be compared with the voltage stored in the target cell $14_{0,1}$.

To carry out the comparison process, the control circuit first sends a control signal on word line $WL_{0,1}$ to cause the target cell to output 112 the voltage stored therein onto the primary bit line $BL_0$. Then, the control circuit sends a control signal on dummy line $DL_1$ to cause the dummy cell $30_1$ to output the reference voltage stored therein onto the complementary bit line $BL_1$. Thereafter, the control circuit sends control signals on both of the read control lines $RCL_0$, $RCL_1$ to activate both of the read gates $34_0$, $34_1$ to convey the voltages on the bit lines $BL_0$, $BL_1$ to the inputs of the comparator 52. The comparator 52 thereafter compares 120 the voltage from the target cell $14_{0,1}$ with the reference voltage from the dummy cell $30_1$ to provide a comparison result on its output. This comparison result is fed to the input of the SAAD 50.

The SAAD 50 thereafter processes the comparison result to determine 124 whether the voltage from the target cell $14_{0,1}$ is higher than the reference voltage from the dummy cell $30_1$. If the voltage from the target cell $14_{0,1}$ is higher, then the SAAD 50 determines 128 a first data bit to be a logical "1". Thereafter, SAAD 50 determines 130 whether more bits remain to be extracted from the target cell. If all data bits have been extracted, then the read operation is complete; hence, SAAD 50 preferably refreshes 142 the target cell (as will be explained later) and terminates operation. Otherwise, SAAD 50 continues operation by generating 132 a new reference voltage based on the previous reference voltage and the comparison result. This new reference voltage represents another guess or approximation of the voltage stored within the target cell $14_{0,1}$. More specifically, in step 132, SAAD 50 generates another reference voltage using the following formula:

$$V_{ref}(x) = V_{ref}(x-1) + (\frac{1}{2})^x MSB, \quad \text{(Eq. 2)}$$

where x represents the number of the reference voltage being generated. That is, if the second reference voltage is being generated, then x is 2. If the third reference voltage is being generated, then x is 3, and so on. As evidenced by the term $V_{ref}(x-1)$, the new reference voltage is based upon the previous reference voltage. After this new reference voltage is generated, then the above process, beginning with step 108, is repeated to compare the new reference voltage to the voltage from the target cell, to determine another bit of data, and (possibly) to generate another reference voltage.

Returning to step 124, if the SAAD 50 determines, based upon the comparison result, that the voltage from the target cell $14_{0,1}$ is not higher than the reference voltage, then the SAAD 50 determines 136 a first data bit to be a logical "0". Thereafter, SAAD 50 determines 138 whether more bits remain to be extracted from the target cell. If all data bits have been extracted, then SAAD 50 preferably refreshes 142 the target cell and terminates operation. Otherwise, SAAD 50 continues operation by generating 140 a new reference voltage based on the previous reference voltage and the comparison result. This new reference voltage represents another guess or approximation of the voltage stored within the target cell $14_{0,1}$. More specifically, in step 140, SAAD 50 generates another reference voltage using the following formula:

$$V_{ref}(x)=V_{ref}(x-1)-(\tfrac{1}{2})^x \text{MSB}. \qquad \text{(Eq. 3)}$$

Notice that the only difference between this equation and equation 2 is that the $(\tfrac{1}{2})^x$ MSB term here is subtracted rather than added to the previous reference voltage. This difference arises due to the fact that, in this instance, the voltage from the target cell $14_{0,1}$ was lower than the previous reference voltage. Once the new reference voltage is generated, the above-described process is repeated, beginning with step 108, to compare the new reference voltage to the voltage from the target cell, to determine another bit of data, and (possibly) to generate another reference voltage. By implementing the process shown in FIG. 4, all of the data bits stored in the target cell $14_{0,1}$ can be determined. Once SAAD 50 determines all of the data bits in the target cell, it outputs the data bits on its digital outputs 53.

As an additional step before terminating operation, SAAD 50 preferably refreshes 142 the target cell $14_{0,1}$. After determining all of the data bits, SAAD 50 preferably generates a refresh voltage corresponding to the data bits extracted from the target cell, and provides this refresh voltage on its analog output 54. In effect, SAAD 50 is performing a digital-to-analog conversion on the extracted data bits. Thereafter, the control circuit sends a control signal on write control line $WCL_0$ to activate the write gate $36_0$ to convey the refresh voltage to the primary bit line $BL_0$. Once that is done, the control circuit sends a control signal on word line $WL_{0,1}$ to activate the target cell $14_{0,1}$ to store the refresh voltage on the primary bit line $BL_0$ into the target cell $14_{0,1}$. Thus, the target cell $14_{0,1}$ is refreshed.

As an overview, several features and advantages of the present invention should be noted. First, note that after each comparison between a reference voltage and the voltage from the target cell, a bit of data is determined. This means that if n bits are stored in a cell, then those bits can be determined or extracted from the cell in n cycles. This represents a significant speed improvement over the serial conversion method of the prior art.

Also, note that a reference voltage is stored in a dummy cell before being compared to the voltage in the target cell. In other words, it is the reference voltage stored within the dummy cell which is compared with the voltage in the target cell. The comparison is performed in this manner in order to minimize the effects of stray capacitance. As noted above, each of the dummy cells $30_0$, $30_1$ preferably has substantially the same capacitance as each of the memory cells 14. Also, the capacitance of each of the bits lines $BL_0$, $BL_1$ is preferably substantially the same. Because these capacitances are equalized, the same stray capacitance effects will affect both the reference voltage and the voltage from the target cell. When these voltages are compared with each other, the stray capacitance effects will cancel each other out. Hence, stray capacitance effects are neutralized in the present invention. This in turn makes it possible to derive more accurate comparison results.

Another notable feature deals with the manner in which successive reference voltages are generated. In general, a reference voltage (other than the first reference voltage) is generated using the following general formula:

$$V_{ref}(x)=V_{ref}(x-1)\pm(\tfrac{1}{2})^x \text{MSB}.$$

This formula has three notable features. First, note from the $V_{ref}(x-1)$ term that each successive reference voltage is based upon a previous reference voltage. Thus, a new reference voltage builds upon prior reference voltages. Second, note that the $(\tfrac{1}{2})^x$ MSB term may be either added or subtracted from the previous reference voltage. Whether this term is added or subtracted depends upon the comparison result derived from the comparator 52. If the voltage from the target cell was higher than the previous reference voltage, then the $(\tfrac{1}{2})^x$ MSB is added to the previous reference voltage. If the voltage from the target cell was lower than the previous reference voltage, then the $(\tfrac{1}{2})^x$ MSB term is subtracted from the previous reference voltage to derive the new reference voltage. From this discussion, it can be seen that the generation of a new reference voltage is based both upon a previous reference voltage and a comparison result.

Figure 5:
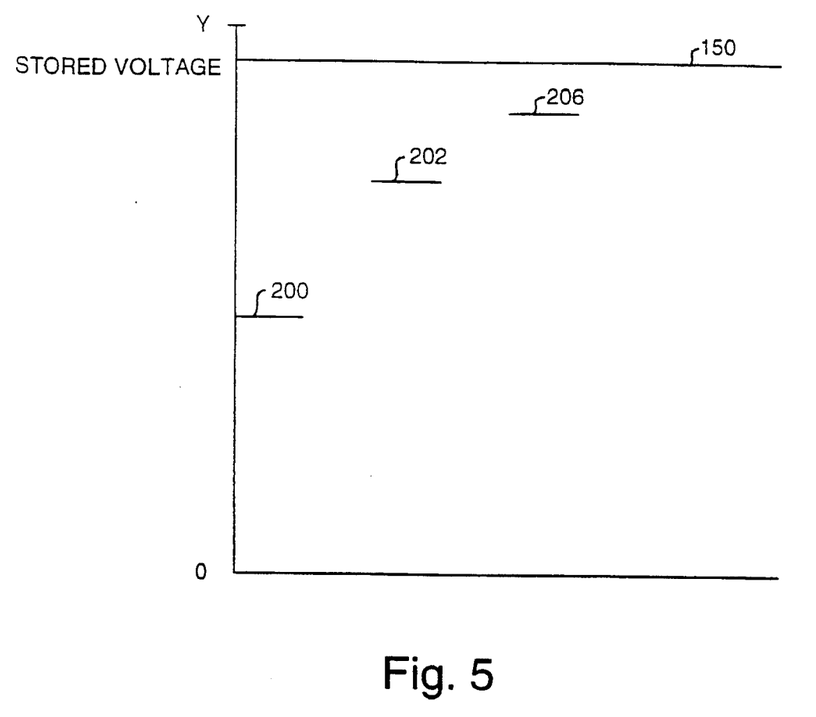
FIG. 5 is a diagram illustrating the "halving" concept of the present invention.

A third notable feature of this general formula is that with each successive reference voltage, the $(\tfrac{1}{2})^x$ MSB term is halved, as evidenced by the $(\tfrac{1}{2})^x$ term. This means that each new reference voltage is set so that it falls substantially halves the voltage range tested by the previous reference voltage. To show this more clearly, suppose that a memory cell has a full voltage range of 0–Y volts, as shown in FIG. 5. Suppose further that a stored voltage shown by line 150 is stored in the cell. For this memory cell, the first reference voltage is set at location 200, at ½ LSB below the midpoint voltage. Since the stored voltage is higher than the first reference voltage, the second reference voltage is set at location 202. Since the stored voltage is still higher than the second reference voltage, the third reference voltage is set at location 206. Note from FIG. 5 that each successive reference voltage is set such that it is substantially in the middle of a voltage range set forth by a previous reference voltage. In other words, each reference voltage substantially halves the voltage range set forth by a previous reference voltage. It is this process of halving the range of possible voltages that gives rise, at least partially, to the present invention's ability to read n bits of data in n cycles.

Figure 6:
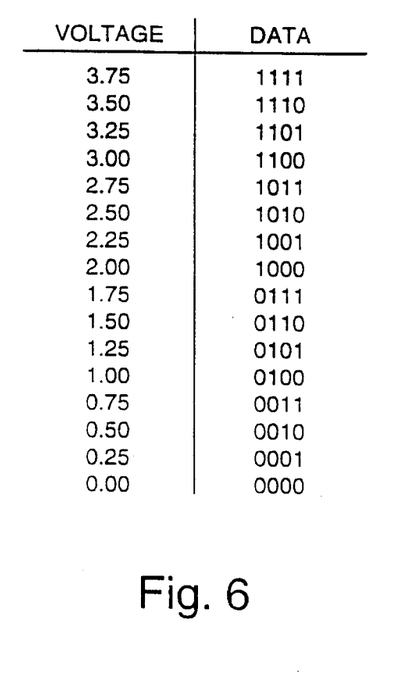
FIG. 6 is a voltage vs. data chart for a memory cell having a full voltage range of four volts storing four bits of data.

The method of the present invention will now be further illustrated with reference to specific examples. Suppose for the sake of illustration that each of the memory cells 14 stores voltages ranging from 0–4 volts and that each cell stores four bits of data. For such a memory cell, the MSB is 4 volts and the LSB is 0.25 volts. A voltage vs. data chart for such a memory cell is shown in FIG. 6. Now suppose further that the target cell is memory cell $14_{1,1}$ and that the target cell has the voltage 2.5 volts (representing data bits "1010") stored therein. Notice that since the target cell $14_{1,1}$ is in cell block $12_1$, cell block $12_1$ will be the primary cell, cell block $12_0$ will be the complementary cell block, bit line $BL_1$ will be the primary bit line, and bit line $BL_0$ will be complementary bit line. Also note that it will be dummy cell $30_0$ which will be used to store the reference voltages.

To read data from the target cell $14_{1,1}$, the primary bit line $BL_1$ is first discharged by activating discharge gate $32_1$. Thereafter, the SAAD 50 generates a first reference voltage. In the current example, the first reference voltage is set as follows:

$$V_{ref}(1)=\frac{1}{2}(4)-\frac{1}{2}(0.25)=1.875 \text{ volts.}$$

Once generated, the first reference voltage is conveyed, via write gate $36_0$, to the complementary bit line $BL_0$. Once there, the reference voltage is stored in the dummy cell $30_0$ coupled to the complementary bit line $BL_0$. Once that is done, both the target cell $14_{1,1}$ and the dummy cell $30_0$ are activated to cause the target cell $14_{1,1}$ to output its stored voltage onto the primary bit line $BL_1$, and to cause the dummy cell $30_0$ to output the reference voltage onto the complementary bit line $BL_1$. The read gates $34_0$, $34_1$ are thereafter activated to allow the comparator 52 to compare the voltage from the target cell $14_{1,1}$ with the first reference voltage from the dummy cell $30_0$. The result of this comparison is passed on to the SAAD 50. In the present example, the voltage from the target cell (2.5 volts) is higher than the first reference voltage (1.875 volts), Thus, the comparison result will indicate that the target voltage is higher. Based on this comparison result, the SAAD 50 determines a first data bit to be a "1".

Thereafter, SAAD 50 proceeds to generate a second reference voltage. Because the target voltage was higher than the previous reference voltage, the second reference voltage will be set to be higher than the previous retirenee voltage. Thus, the second reference voltage is set as follows:

$$V_{ref}(2)=1.875+(\frac{1}{2})^2(4)=2.875 \text{ volts.}$$

Once set, the second reference voltage is stored in the dummy cell $30_0$ in the same manner as before, and thereafter compared with the target voltage from the target cell $14_{1,1}$. This time, the reference voltage (2.875 volts) is higher than the target voltage (2.5 volts). Thus, the comparison result from the comparator 52 will indicate that the target voltage is not higher than the reference voltage. Based on this result, the SAAD 50 determines a second data bit to be a "0".

SAAD 50 thereafter proceeds to generate a third reference voltage. Because the target voltage was lower than the previous reference voltage, the third reference voltage will be set to be lower than the previous reference voltage. Thus, the third reference voltage is set as follows:

$$V_{ref}(3)=2.875-(\frac{1}{2})^3(4)=2.375 \text{ volts.}$$

Again, this reference voltage is stored in dummy cell $30_0$, and then compared with the target voltage from the target cell $14_{1,1}$. This time, the target voltage (2.5 volts) is higher than the reference voltage (2.375 volts). Thus, the comparison result will indicate that the target voltage is higher. Based on this result, the SAAD 50 determines a third data bit to be a "1".

Finally, the SAAD 50 generates a fourth refe was higher than the previous reference voltage, the fourth reference voltage will be set to be higher than the previous reference voltage. Hence, the fourth reference voltage is set as follows:

$$V_{ref}(4)=2.375+(\frac{1}{2})^4(4)=2.625 \text{ volts.}$$

Thereafter, the reference voltage is again stored in dummy cell $30_0$, and then compared with the target voltage. This time, the target voltage (2.5 volts) is lower than the reference voltage (2.625 volts). Thus, the SAAD 50 determines the fourth bit of data to be a "0". All of the data bits stored in the target cell $14_{1,1}$ have now been determined to be "1010". Comparing this result with the table shown in FIG. 6, it is seen that the data corresponding to 2.5 volts is indeed "1010". Thus, the method of the present invention obtains the correct result. Once SAAD 50 determines all of the data bits, it outputs the data bits on its digital outputs 53.

As a final step, SAAD 50 refreshes the target cell $14_{1,1}$. To do this, the SAAD 50 first converts the derived data bits "1010" into its corresponding analog voltage of 2.5 volts. This involves a typical digital-to-analog conversion. Thereafter, the refresh voltage of 2.5 volts, outputted on the SAAD's analog output 54, is stored back into the target cell $14_{1,1}$ to refresh the cell. Thus, the target cell is refreshed as a regular part of the reading process.

As a further example, suppose that the same target cell $14_{1,1}$ is chosen but that this time. the voltage stored in the cell is 0.75 volts, corresponding to data bits "0011", as shown in FIG. 6. The same general process is followed. Namely, the primary bit line $BL_1$ is first discharged, Then, the SAAD 50 generates the first reference voltage as follows:

$$V_{ref}(1)=\frac{1}{2}(4)-\frac{1}{2}(0.25)=1.875 \text{ volts.}$$

Comparing this reference voltage to the target voltage of 0.75 volts, the comparator 52 will provide a comparison result indicating that the target voltage is lower than the reference voltage. Hence, the first bit of dam is determined to be a "0".

Because the target voltage was lower than the first reference voltage, the second reference voltage will be set to be lower than the first reference voltage. Thus, the second reference voltage is set as follows:

$$V_{ref}(2)=1.875-(\frac{1}{2})^2(4)=0.875 \text{ volts.}$$

Comparing this voltage to the target voltage of 0.75, the comparator again provides an indication that the target voltage is lower than the reference voltage. Thus, the SAAD 50 determines the second data bit to be a "0".

Because the target voltage was again lower than the reference voltage, the third reference voltage will again be set to be lower than the previous reference voltage. Hence, the third reference voltage is set as follows:

$$V_{ref}(3)=0.875-(\frac{1}{2})^3(4)=0.375 \text{ volts.}$$

When this reference voltage is compared with the target voltage of 0.75 volts, the comparator 52 will indicate that the target voltage this time is higher than the reference voltage. Thus, in response, the SAAD 50 sets the third data bit to be a "1".

Finally, the SAAD 50 generates a fourth reference voltage. Because the target voltage was higher than the previous reference voltage, this reference voltage will be set to be higher than the previous reference voltage. Thus, the fourth reference voltage is set as follows:

$$V_{ref}(4)=0.375+(\frac{1}{2})^4(4)=0.625 \text{ volts.}$$

When the comparator 52 compares this reference voltage to the target voltage of 0.75 volts, it will provide an indication that the target voltage is higher. The SAAD 50, in response to this comparison result, sets the fourth data bit to be a "1".

The data bits "0011" are thus derived from the target cell. Comparing this to the data in FIG. 6, it is seen that again the correct result is obtained using the method of the present invention. Once derived, the data bits are outputted on the digital outputs 53 of the SAAD 50. As a final step in the reading process, the target cell $14_{1,1}$ is refreshed in the manner described above.

Thus far, the invention has been described as comprising a SAAD 50 for each complementary pair of cell blocks $12_0$, $12_1$. It should be noted, however, that if so desired, a single SAAD 50 can be shared by multiple pairs of cell blocks $12_0$, $12_1$. To implement such an embodiment, multiplexers are preferably used to selectively couple one pair of cell blocks to the SAAD 50 at a time. This multiplexed embodiment is advantageous in that it reduces the amount of circuitry needed to implement the invention. It is slower, however. Thus, which embodiment is used depends on the requirements of the specific application.

The invention has now been fully described. While the invention has been illustrated with retirenee to specific embodiments, the invention should not be construed to be so limited. Various modifications may be made by one of ordinary skill in the art with the benefit of this disclosure without departing from the spirit of the invention. Thus, the invention should not be limited by the examples used to illustrate it but only by the scope of the appended claims.

What is claimed is:

1. A method for reading data from a multi-bit memory cell, comprising the steps of:
   generating a first reference voltage;
   outputting from a memory cell a stored voltage representing multiple bits of data;
   comparing said stored voltage with said first reference voltage to derive a first comparison result;
   determining a first bit of data based on said first comparison result;
   generating a second reference voltage based on said first reference voltage and said first comparison result;
   comparing said stored voltage with said second reference voltage to derive a second comparison result; and
   determining a second bit of data based on said second comparison result.

2. The method of claim 1, further comprising the steps of:
   generating a third reference voltage based on said second reference voltage and said second comparison result;
   comparing said stored voltage with said third reference voltage to derive a third comparison result; and
   determining a third bit of data based on said third comparison result.

3. The method of claim 1, wherein the step of determining the first bit of data comprises the steps of:
   determining said first bit of data to be a logical "1" in response to said first comparison result indicating that said stored voltage is higher than said first reference voltage; and
   determining said first bit of data to be a logical "0" in response to said first comparison result indicating that said stored voltage is lower than said first reference voltage.

4. The method of claim 3, wherein the step of determining the second bit of data comprises the steps of:
   determining said second bit of data to be a logical "1" in response to said second comparison result indicating that said stored voltage is higher than said second reference voltage; and
   determining said second bit of data to be a logical "0" in response to said second comparison result indicating that said stored voltage is lower than said second reference voltage.

5. The method of claim 1, wherein said first reference voltage is generated according to the following formula:

$$\text{First reference voltage} = V_{ref}(1) = \tfrac{1}{2}\text{MSB} - \tfrac{1}{2}\text{LSB};$$

where MSB represents a range of voltages stored in the multi-bit memory cell; and where LSB represents a voltage step between logic levels stored in the multi-bit memory cell.

6. The method of claim 5, wherein the step of generating the second reference voltage comprises the steps of:
   in response to said first comparison result indicating that said stored voltage is higher than said first reference voltage, generating said second reference voltage according to the following formula:

$$\text{Second reference voltage} = V_{ref}(2) = V_{ref}(1) + (\tfrac{1}{2})^2\text{MSB}; \text{ and}$$

in response to said first comparison result indicating that said stored voltage is lower than said first reference voltage, generating said second reference voltage according to the following formula:

$$\text{Second reference voltage} = V_{ref}(2) = V_{ref}(1) - (\tfrac{1}{2})^2\text{MSB}.$$

7. In a memory having a multi-bit memory cell coupled to a first bit line and a dummy cell coupled to a second bit line, a method for reading data from the memory cell, comprising the steps of:
   generating a first reference voltage;
   storing said first reference voltage in the dummy cell;
   outputting, from the memory cell onto the first bit line, a stored voltage representing multiple bits of data;
   outputting, from the dummy cell onto the second bit line, said first reference voltage;
   comparing said stored voltage on the first bit line with said first reference voltage on the second bit line to derive a first comparison result;
   determining a first bit of data based on said first comparison result;
   generating a second reference voltage based on said first reference voltage and said first comparison result;
   storing said second reference voltage in the dummy cell;
   outputting, from the dummy cell onto the second bit line, said second reference voltage;
   comparing said stored voltage on the first bit line with said second reference voltage on the second bit line to derive a second comparison result; and
   determining a second bit of data based on said second comparison result.

8. The method of claim 7, further comprising the step of:
   discharging the first bit line prior to outputting said stored voltage onto the first bit line.

9. The method of claim 7, wherein the step of determining the first bit of data comprises the steps of:
   determining said first bit of data to be a logical "1" in response to said first comparison result indicating that said stored voltage is higher than said first reference voltage; and
   determining said first bit of data to be a logical "0" in response to said first comparison result indicating that said stored voltage is lower than said first reference voltage.

10. The method of claim 9, wherein the step of determining the second bit of data comprises the steps of:

determining said second bit of data to be a logical "1" in response to said second comparison result indicating that said stored voltage is higher than said second reference voltage; and determining said second bit of data to be a logical "0" in response to said second comparison result indicating that said stored voltage is lower than said second reference voltage.

11. The method of claim 7, wherein said first reference voltage is generated according to the following formula:

First reference voltage=$V_{ref}(1)=\frac{1}{2}$MSB$-\frac{1}{2}$LSB;

where MSB represents a range of voltages stored in the multi-bit memory cell; and where LSB represents a voltage step between logic levels stored in the multi-bit memory cell.

12. The method of claim 11, wherein the step of generating the second reference voltage comprises the steps of:

in response to said first comparison result indicating that said stored voltage is higher than said first reference voltage, generating said second reference voltage according to the following formula:

Second reference voltage=$V_{ref}(2)=V_{ref}(1)+(\frac{1}{2})^2$MSB; and in response to said first comparison result indicating that said stored voltage is lower than said first reference voltage, generating said second reference voltage according to the following formula:

Second reference voltage=$V_{ref}(2)=V_{ref}(1)-(\frac{1}{2})^2$MSB.

* * * * *